(12) United States Patent
Zhang

(10) Patent No.: US 8,331,085 B2
(45) Date of Patent: Dec. 11, 2012

(54) ELECTRONIC DEVICE

(75) Inventor: Yang Zhang, Shanghai (CN)

(73) Assignee: Inventec Corporation, Taipei (TW)

( * ) Notice: Subject to any disclaimer, the term of this patent is extended or adjusted under 35 U.S.C. 154(b) by 178 days.

(21) Appl. No.: 13/026,304

(22) Filed: Feb. 14, 2011

(65) Prior Publication Data

US 2012/0134101 A1 May 31, 2012

(30) Foreign Application Priority Data

Nov. 30, 2010 (TW) ................................ 99141536 A

(51) Int. Cl.
*H05K 5/00* (2006.01)
*H05K 7/16* (2006.01)
*H05K 7/14* (2006.01)
*H01R 4/00* (2006.01)
*H01R 13/46* (2006.01)

(52) U.S. Cl. ............ 361/679.39; 361/679.37; 361/679.4; 361/724; 361/725; 361/726; 174/365; 174/542; 174/559; 174/59; 174/60

(58) Field of Classification Search .. 361/679.31–679.4, 361/679.55–679.6, 724–727; 174/363–387, 174/542, 559–563, 59–64, 138 B, 138 D, 174/170; 369/75.11, 75.21, 76, 77.11, 77.21, 369/78, 79, 80, 81, 82

See application file for complete search history.

(56) References Cited

U.S. PATENT DOCUMENTS

| | | | | |
|---|---|---|---|---|
| 6,621,692 B1 * | 9/2003 | Johnson et al. | .......... | 361/679.55 |
| 2003/0042824 A1 * | 3/2003 | Coffin et al. | ................ | 312/223.2 |
| 2008/0164795 A1 * | 7/2008 | Peng et al. | ................. | 312/334.5 |

* cited by examiner

*Primary Examiner* — Jayprakash N Gandhi
*Assistant Examiner* — Jerry Wu
(74) *Attorney, Agent, or Firm* — Jianq Chyun IP Office

(57) ABSTRACT

An electronic device includes a chassis, first and second rails, first and second sliding elements and a hard disc module. The chassis has two side plates and a front end. The first and second rails configured in the chassis are parallel to the side plates. The first and second sliding elements are slidably configured on the first and second rails respectively. The hard disc module includes a hard disc frame and hard discs pluggably configured therein. The hard disc frame has a back end and first and second sides parallel to the side plates. The second side has hard disc plugging openings. The first and second sliding elements respectively connect the first side and the back end. The hard disc frame is located between the first and second rails. The hard disc module is suitable for being pulled out from the chassis when the first and second sliding elements slide.

14 Claims, 15 Drawing Sheets

ELECTRONIC DEVICE

CROSS-REFERENCE TO RELATED APPLICATION

This application claims the priority benefit of Taiwan application serial no. 99141536, filed on Nov. 30, 2010. The entirety of the above-mentioned patent application is hereby incorporated by reference herein and made a part of this specification.

BACKGROUND OF THE INVENTION

1. Field of the Invention

The invention relates to an electronic device. More particularly, the invention relates to an electronic device having an extractable hard disc module.

2. Description of Related Art

A server is the core which serves all the computers in a network system and has the functions of providing network users with discs, printing services, and so forth. Meanwhile, the server allows the users to share the resources in the network. The basic framework of the server is approximately the same as that of an ordinary personal computer and includes a central processing unit (CPU), a memory, and input/output (I/O) equipment, which are connected by a bus inside. Through north bridge chips, the CPU and the memory are connected, and through south bridge chips, the I/O equipment is connected. Based on the structure of a chassis, the development of the server may be roughly divided into three phases: the early tower chassis, the rack mountable chassis characterized by the concentration property, and the blade server characterized by high-density calculation.

The rack mountable server is given as an example here. The rack mountable server is a server which has appearance of standard design and is used together with the chassis. In other words, the rack mountable server is a tower server having an improved framework, and its purpose is to reduce the space occupied in the server as much as possible. Many specialized network equipment adopts the rack mountable structure, which is mostly flat type, like drawers. The aforesaid network equipment includes, for example, exchangers, routers, hardware firewalls, etc. The width of the rack mountable server is 19 inches, and the height of the rack mountable server is measured by the unit U (1U=1.75 inches=44.45 millimeters). In general, the server has 1U, 2U, 3U, 4U, 5U, and 7U types.

The size of the chassis is also regulated by industrial standards, generally from 22U to 42U. Detachable sliding trays may be configured in the chassis based on the height (U) of the chassis. The user may flexibly adjust the height of the chassis according to the height of the server for storing network equipment, such as servers, hubs, disc array cabinets, and so forth. After the server is placed, all the I/O wires thereof may be led out from the rear of the chassis and organized in the wire trenches of the chassis (all the interfaces of the rack mountable server are also located at the rear). Number labels are commonly used to facilitate management of the wires.

In most cases, the hard disc module, the motherboard module, the power connection interface, and the data transmission interface in the rack mountable server are not located at the same side of the chassis. Therefore, the user cannot extract the hard disc module and the motherboard module from the same side of the chassis, nor can the user plug or unplug the power cords or data transmission cables from the same side of the chassis, which causes inconvenience to the user.

SUMMARY OF THE INVENTION

The invention is directed to an electronic device in which a hard disc module, a power connection interface, and a data transmission interface are located at a front end of a chassis, and the hard disc module can be easily extracted from the front end.

The invention provides an electronic device that includes a chassis, a first rail, a second rail, a first sliding element, a second sliding element, and a hard disc module. The chassis has two side plates and a front end. The first and second rails are configured in the chassis and parallel to the side plates. The first and second sliding elements are slidably configured on the first and second rails, respectively. The hard disc module includes a hard disc frame and a plurality of hard discs. The hard disc frame has a back end, a first side, and a second side. The first and second sides are parallel to the side plates of the chassis. The second side has hard disc plugging openings. The first sliding element is connected to the first side of the hard disc frame, and the second sliding element is connected to the back end of the hard disc frame, such that the hard disc frame is located between the first and second rails. The hard disc module is suitable for being entirely pulled out from the front end of the chassis by sliding the first and second sliding elements relative to the first and second rails. The hard discs are pluggably configured in the hard disc frame. When the hard disc frame is pulled out from the chassis, the hard discs are suitable for being installed into or uninstalled from the hard disc frame through the hard disc plugging openings.

According to an embodiment of the invention, the electronic device further includes a back plate configured on the hard disc frame, and the hard discs are electrically connected to the back plate.

According to an embodiment of the invention, the electronic device further includes an adaptor board and a plurality of cables. The adaptor board is configured in the chassis, and the cables are connected between the adaptor board and the hard disc module.

According to an embodiment of the invention, the back plate has a plurality of connectors respectively connected to the cables.

According to an embodiment of the invention, the electronic device further includes a cable arranging module, and the cable arranging module includes a fixing frame and a flexible frame. The fixing frame is fixed into the chassis, and a first segment of each of the cables is fixed to the fixing frame. The flexible frame is connected between the fixing frame and the hard disc module. A second segment of each of the cables is fixed to the flexible frame and is bent together with the flexible frame when the hard disc module drives the flexible frame to move relative to the chassis.

According to an embodiment of the invention, the electronic device further includes a motherboard module configured in the chassis. The cable arranging module and the first rail are located between the motherboard module and the hard disc module.

According to an embodiment of the invention, the first sliding element is slidably configured at the first side of the hard disc frame. The first sliding element is suitable for sliding relative to the first rail, such that a portion of the first sliding element extends from the first rail. The hard disc module is suitable for sliding relative to the first sliding element and moves to the portion of the first sliding element extending from the first rail, such that the hard disc module is completely separated from the first rail.

According to an embodiment of the invention, the second sliding element includes a sliding portion and a fixing portion. The sliding portion is slidably configured on the second rail. The fixing portion is fixed to the back end of the hard disc frame. The second sliding element is suitable for sliding relative to the second rail, such that the fixing portion extends from the second rail, and that the hard disc module is completely separated from the second rail.

According to an embodiment of the invention, the sliding portion and the fixing portion are two plate-shaped structures perpendicular to each other. The second sliding element further includes a structure enhancement plate connected between the sliding portion and the fixing portion.

According to an embodiment of the invention, the electronic device further includes a data transmission interface configured at the front end of the chassis.

According to an embodiment of the invention, the electronic device further includes a power connection interface configured at the front end of the chassis.

According to an embodiment of the invention, the back plate is fixed to the first side of the hard disc frame.

According to an embodiment of the invention, the electronic device further includes a third sliding element fixed to the hard disc module. The first rail has a first locking slot. The first sliding element has a first elastic piece. The first elastic piece has a first locking hook facing the first rail. The third sliding element is slidably configured on the first sliding element and suitable for sliding relative to the first sliding element along a path. The first locking hook leans against the first rail and is located on the path. When the third sliding element is driven to move from a first position along a first direction, the third sliding element pushes the first locking hook to move the first sliding element toward the first locking slot along the first direction, and the first locking hook locks the first locking slot and moves away from the path. When the third sliding element is continuously driven to move along the first direction, the third sliding element resists an elastic force of the first elastic piece, passes the first elastic piece, and arrives at a second position.

According to an embodiment of the invention, the first sliding element has a second locking slot, and the third sliding element has a second elastic piece. When the third sliding element arrives at the second position, an end of the second elastic piece is locked to the second locking slot to stop the third sliding element from continuously moving along the first direction.

According to an embodiment of the invention, the second elastic piece has a second locking hook suitable for locking the second locking slot. The second locking hook has a guiding inclined surface and a stopping surface opposite to the guiding inclined surface. Here, the second locking hook is suitable for being guided by the guiding inclined surface to lock the second locking slot and is suitable for being interfered by the stopping surface and positioned in the second locking slot.

According to an embodiment of the invention, the first rail has a stopping wall. When the third sliding element is driven and moved from the second position along a second direction opposite to the first direction to push the first elastic piece, the first sliding element is driven and moved toward the stopping wall and leans against the stopping wall, such that the first sliding element is stopped from moving along the second direction. When the third sliding element is continuously driven and moved along the second direction, the third sliding element resists the elastic force of the first elastic piece, passes the first elastic piece, and arrives at the first position. When the third sliding element is located at the first position, the third sliding element leans against the stopping wall, such that the third sliding element is stopped from moving along the second direction.

Based on the above, the hard disc module of the electronic device is located at the front end of the chassis in this invention. Thereby, the user can easily extract the hard disc module from the front end of the chassis. Besides, the hard disc module can be completely pulled out from the front end of the chassis by sliding the first and second sliding elements relative to the first and second rails, so as to maintain or replace the hard disc module.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
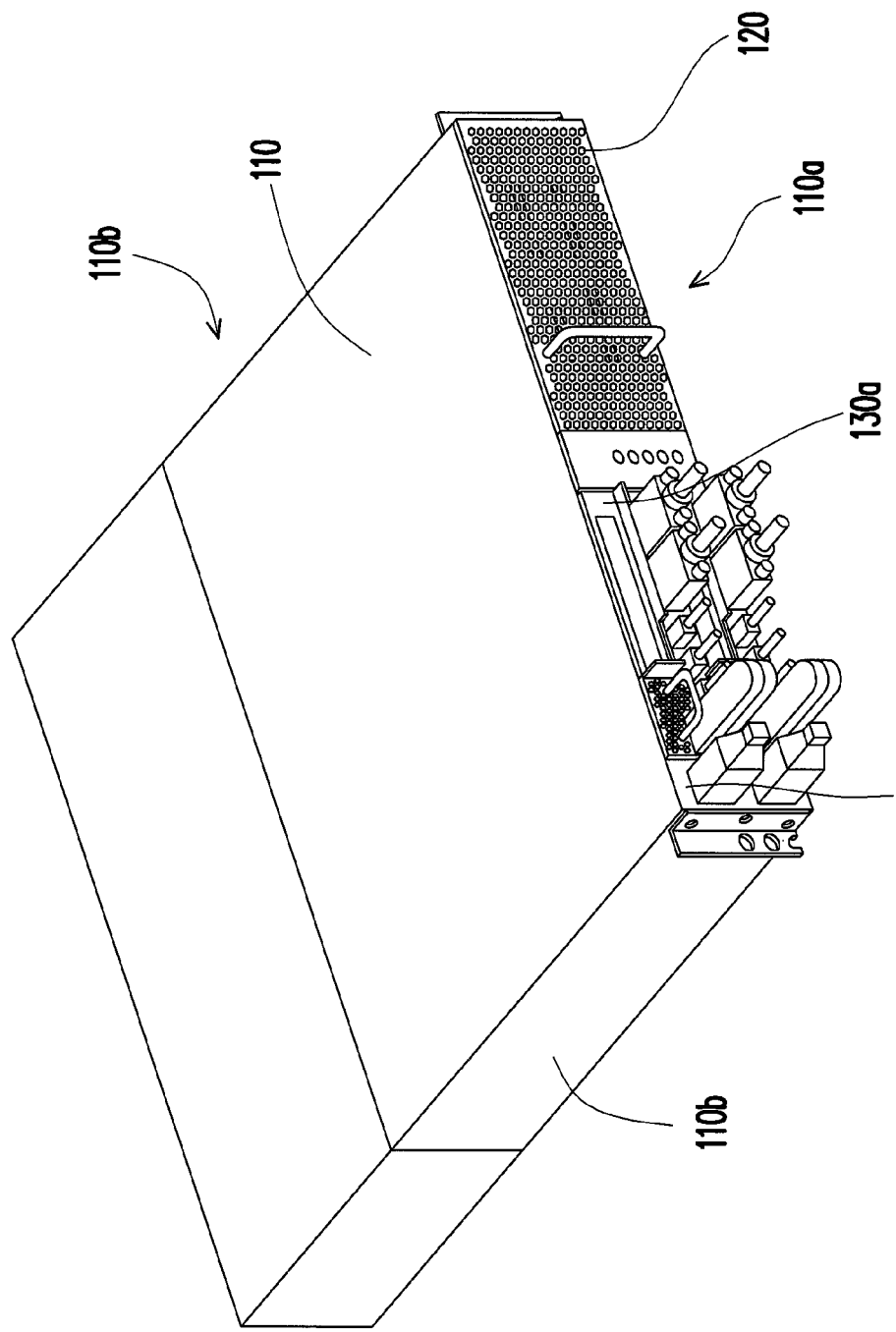
FIG. 1 is a three-dimensional view illustrating an electronic device according to an embodiment of the invention.

FIG. 1 is a three-dimensional view illustrating an electronic device according to an embodiment of the invention. With reference to FIG. 1, the electronic device 100 of this embodiment includes a chassis 110, a hard disc module 120, a data transmission interface 130a, and a power connection interface 130b. The chassis 110 has a front end 110a and two side plates 110b. The data transmission interface 130a and the power connection interface 130b are configured at the front end 110a of the chassis 110. In this embodiment, the electronic device 100 is a server, for example, and the hard disc module 120 is an extractable hard disc module, for instance.

Figure 2:
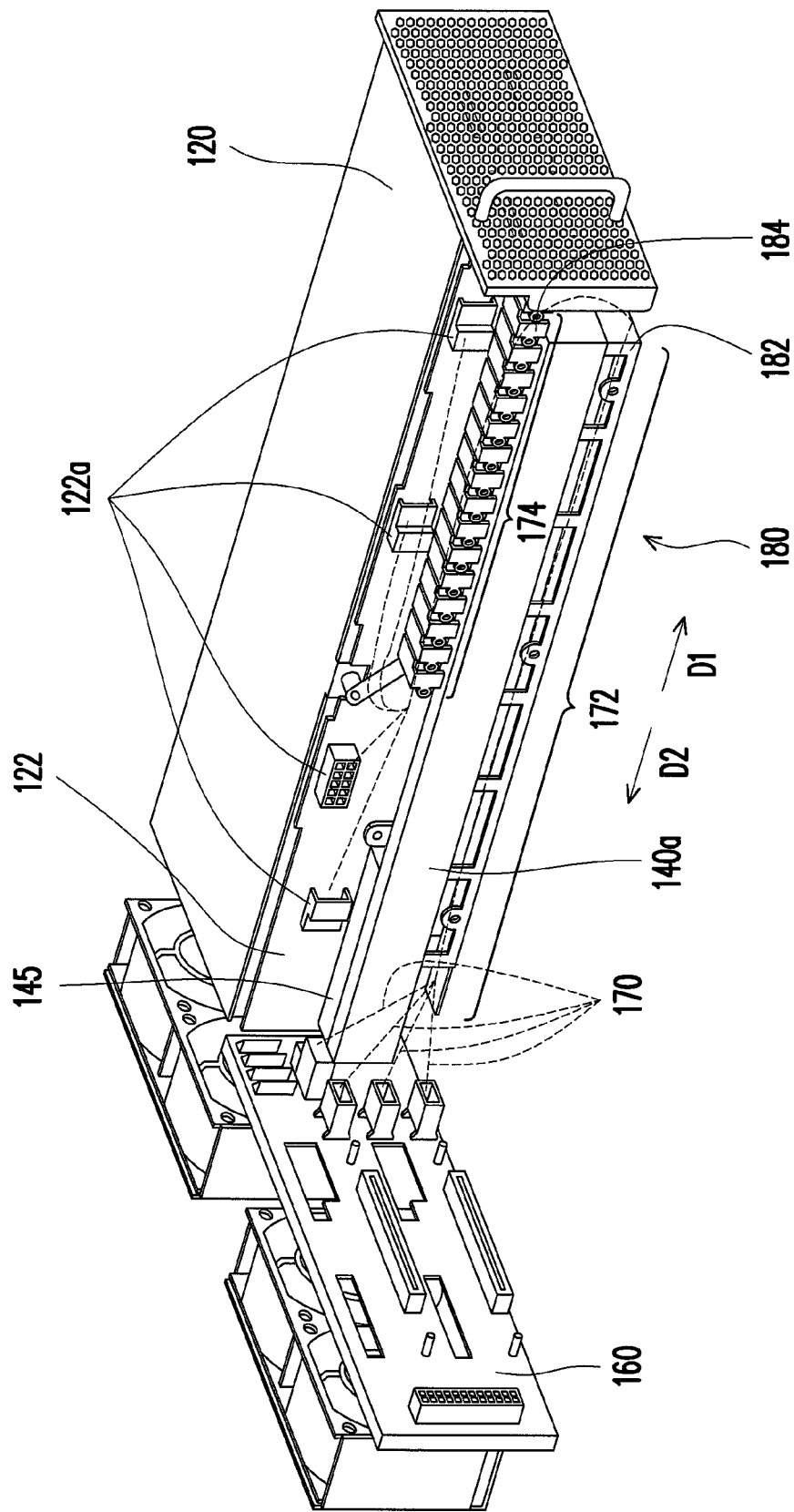
FIG. 2 is a three-dimensional view illustrating some components in the electronic device depicted in FIG. 1.
Figure 3:
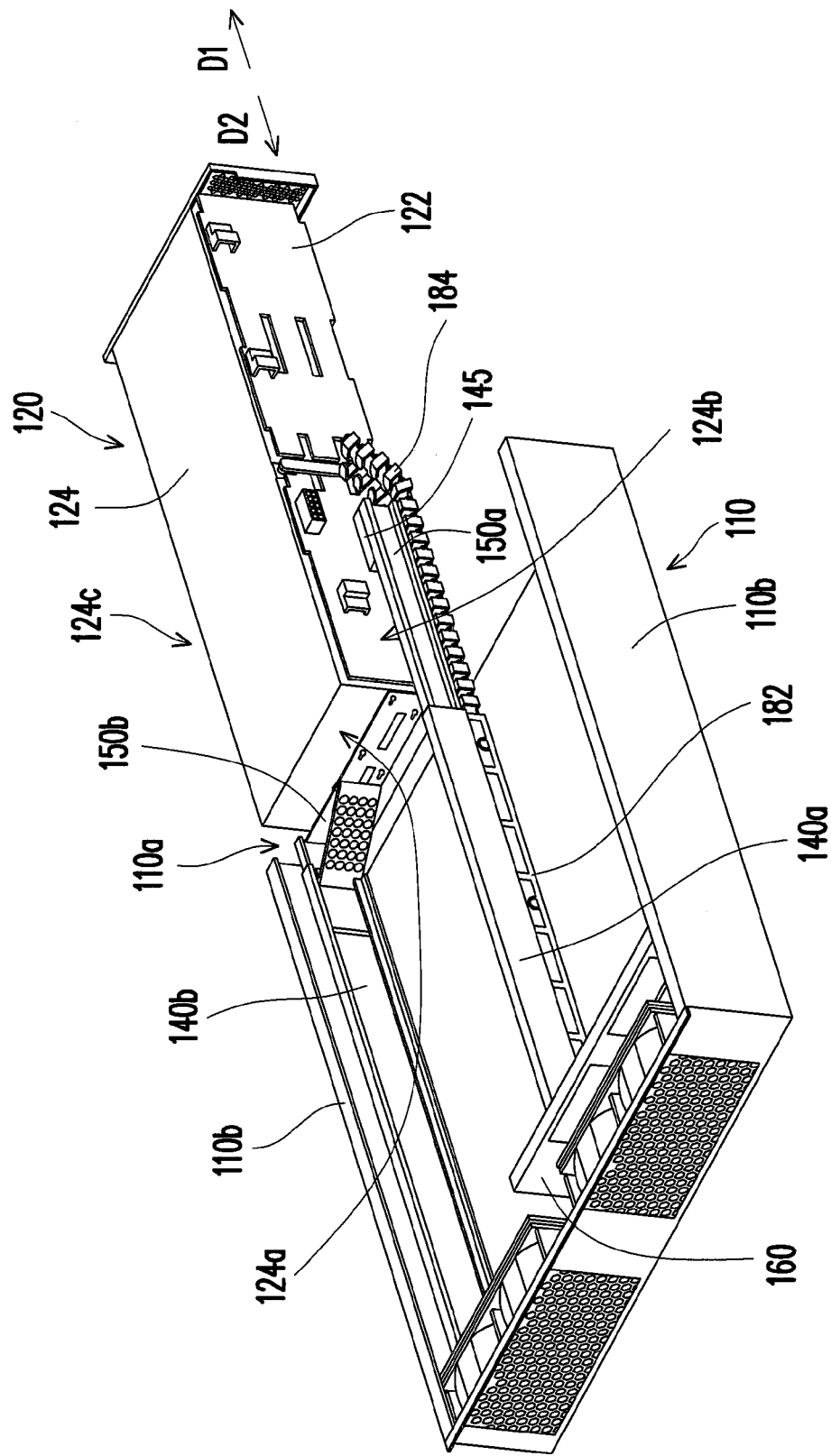
FIG. 3 is a schematic view illustrating that the hard disc module depicted in FIG. 1 is pulled out from the chassis.

FIG. 2 is a three-dimensional view illustrating some components in the electronic device depicted in FIG. 1. FIG. 3 is a schematic view illustrating that the hard disc module depicted in FIG. 1 is pulled out from the chassis. With reference to FIG. 2 and FIG. 3, the electronic device 100 of this embodiment further includes a first rail 140a, a second rail 140b, a first sliding element 150a, and a second sliding element 150b. The first and second rails 140a and 140b are configured in the chassis 110 and parallel to the side plates 110b. The first and second sliding elements 150a and 150b are slidably configured on the first and second rails 140a and 140b, respectively.

Figure 4:
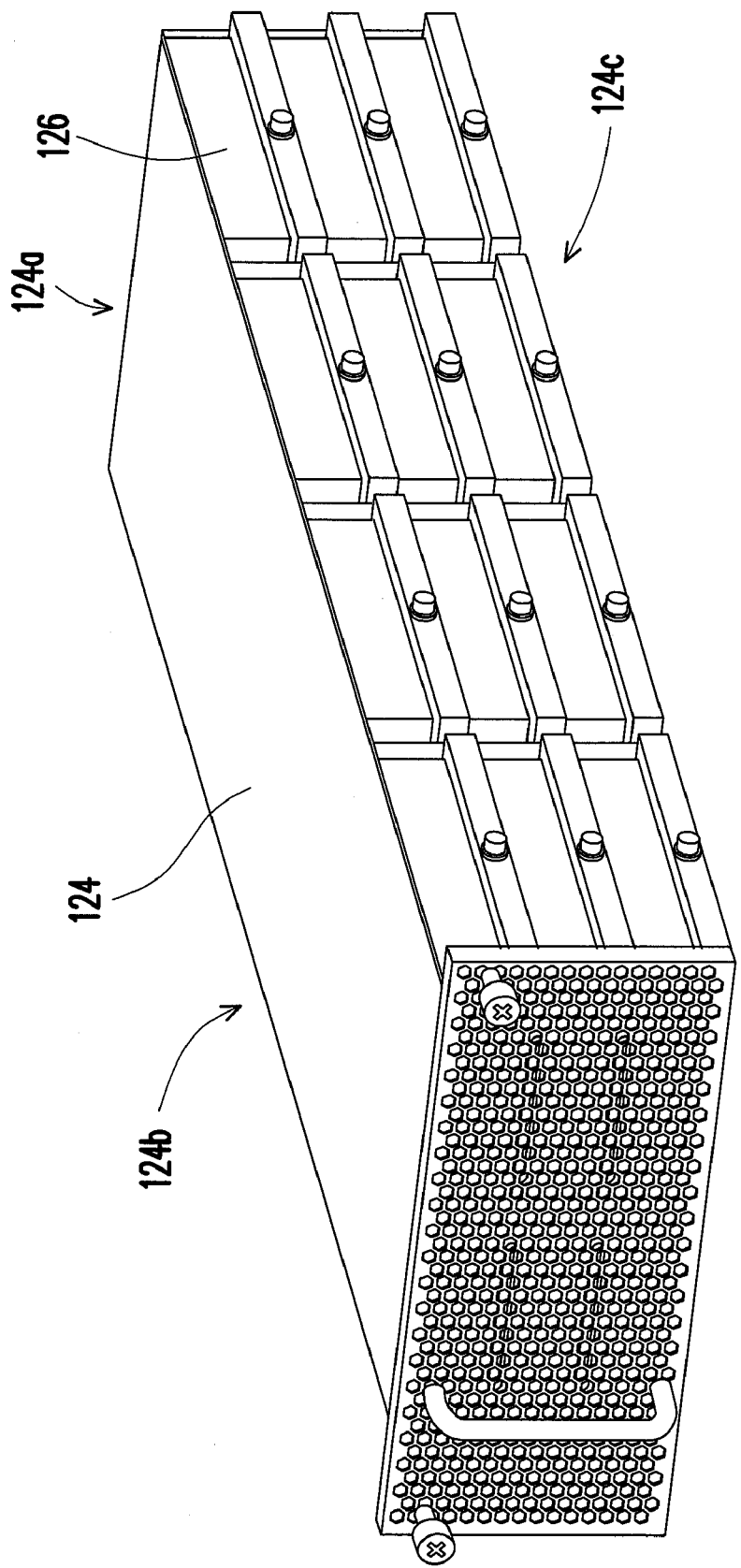
FIG. 4 is a three-dimensional view illustrating the hard disc module depicted in FIG. 2.
Figure 5:
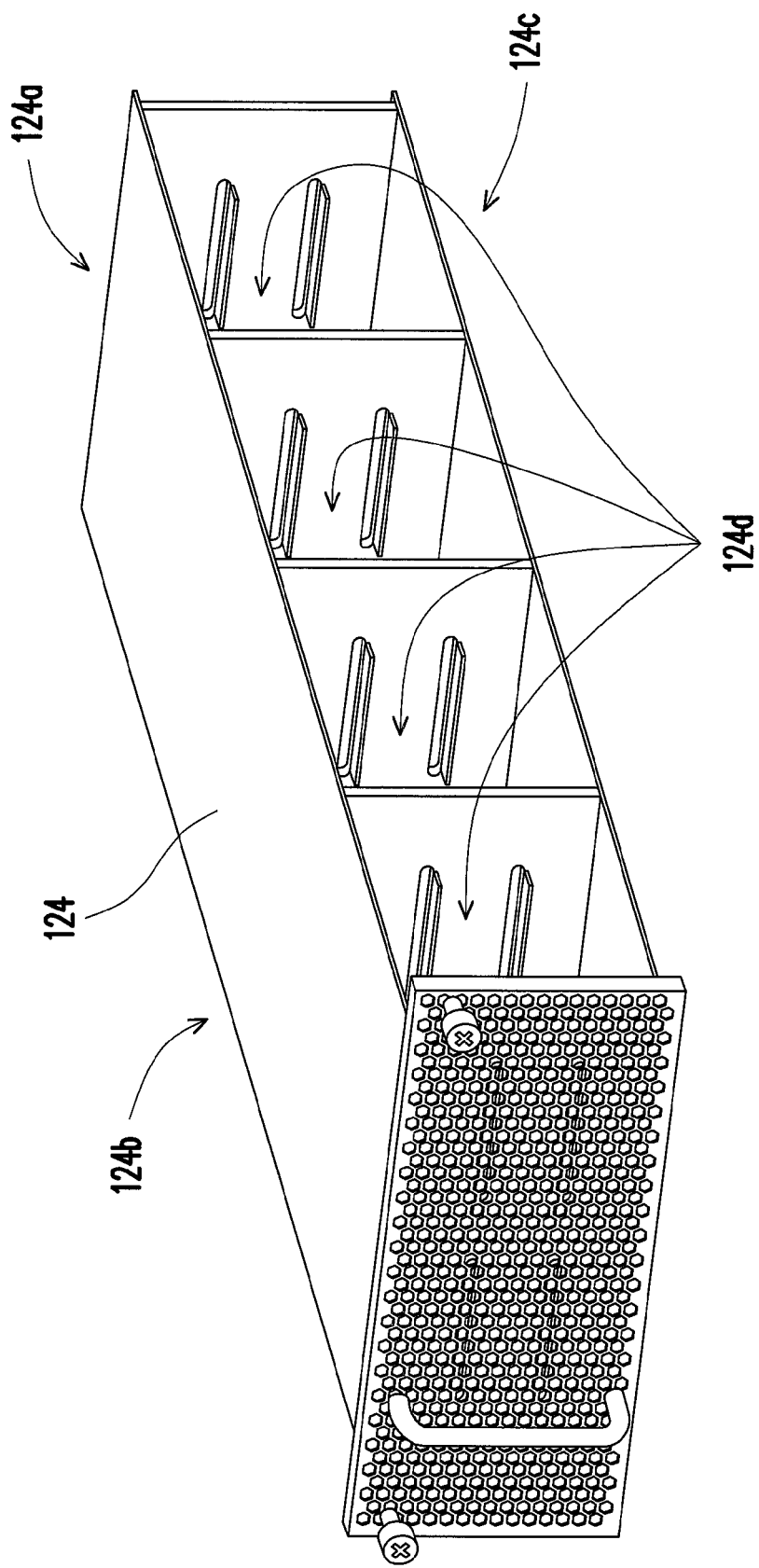
FIG. 5 is a three-dimensional view illustrating some components in the hard disc module depicted in FIG. 4.
Figure 6:
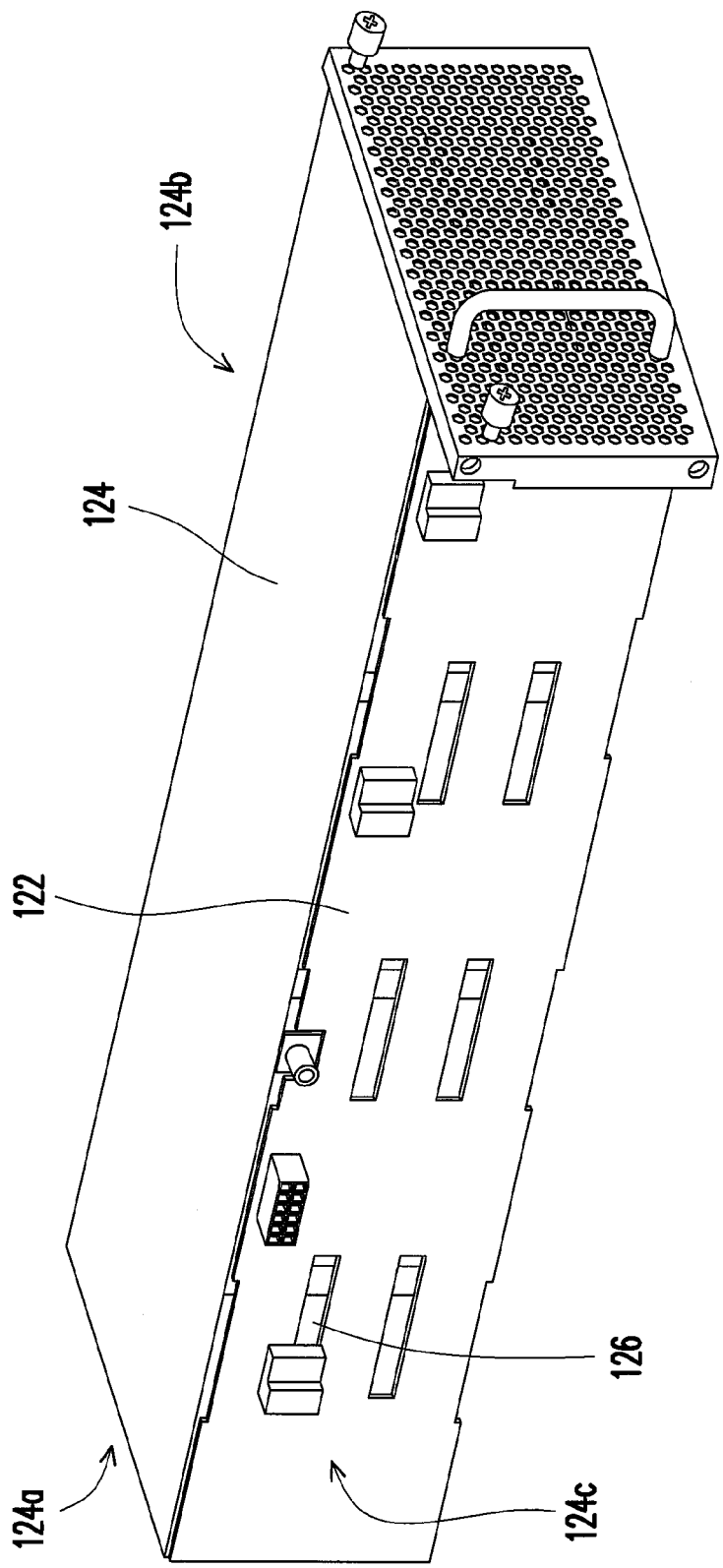
FIG. 6 is a three-dimensional view illustrating the hard disc module depicted in FIG. 4 from another view angle.

FIG. 4 is a three-dimensional view illustrating the hard disc module depicted in FIG. 2. FIG. 5 is a three-dimensional view illustrating some components in the hard disc module depicted in FIG. 4. FIG. 6 is a three-dimensional view illustrating the hard disc module depicted in FIG. 4 from another view angle. As shown in FIG. 3 to FIG. 6, the hard disc module 120 includes a hard disc frame 124 and a plurality of hard discs 126. The hard disc frame 124 has a back end 124a, a first side 124b, and a second side 124c. The first and second sides 124b and 124c are parallel to the side plates 110b. The second side 124c has a plurality of hard disc plugging openings 124d. The first sliding element 150a is connected to the first side 124b of the hard disc frame 124, and the second sliding element 150b is connected to the back end 124a of the hard disc frame 124, such that the hard disc frame 124 is located between the first and second rails 140a and 140b. The hard disc module 120 is suitable for being entirely pulled out from the front end 110a of the chassis 110 by sliding the first and second sliding elements 150a and 150b relative to the first and second rails 140a and 140b. The hard discs 126 are pluggably configured in the hard disc frame 124. When the hard disc frame 124 is pulled out from the chassis 110, the hard discs 126 are suitable for being installed into or uninstalled from the hard disc frame 124 through the hard disc plugging openings 124d.

Under said configuration, the hard disc module 120, the power connection interface 130b, and the data transmission interface 130a are located at the front end 110a of the chassis 110, such that a user can easily extract the hard disc module 120 and plug/unplug the power cords (not shown) and data transmission cables (not shown) from the front end 110a of the chassis 110. Besides, the configuration of the first sliding element 150a and the second sliding element 150b allows the hard disc module 120 to be completely pulled out from the front end 110a of the chassis 110, and the user can then maintain or replace the hard disc module 120.

With reference to FIG. 2 and FIG. 3, in this embodiment, the electronic device 100 further includes an adaptor board 160 and a plurality of cables 170. The adaptor board 160 is configured in the chassis 110, and the cables 170 are connected between the adaptor board 160 and the hard disc module 120. The hard disc module 120 has a back plate 122 configured at the first side 124b of the hard disc frame 124. The back plate 122 has a plurality of connectors 122a respectively connected to the cables 170. The hard discs 126 are electrically connected to the back plate 122. Note that the cables 170 are schematically depicted in FIG. 2 in the form of dotted lines for clear illustration.

As indicated in FIG. 2, the electronic device 100 of this embodiment further includes a cable arranging module 180, and the cable arranging module 180 includes a fixing frame 182 and a flexible frame 184. The fixing frame 182 is fixed into the chassis 110. A first segment 172 of each of the cables 170 is fixed to the fixing frame 182. The flexible frame 184 is connected between the fixing frame 182 and the hard disc module 120. A second segment 174 of each of the cables 170 is fixed to the flexible frame 184. When the hard disc module 120 drives the flexible frame 184 to move relative to the chassis 110, each of the second segments 174 is bent together with the flexible frame 184, and thereby the flexible operation of the entire structure can be ensured. An end of the flexible frame 184 is connected to the hard disc module 120. Hence, the relative position of ends of the cables 170 and the hard disc module 120 can be maintained, and the cables 170 do not come off from the hard disc module 120 because of the movement of the hard disc module 120.

Figure 7:
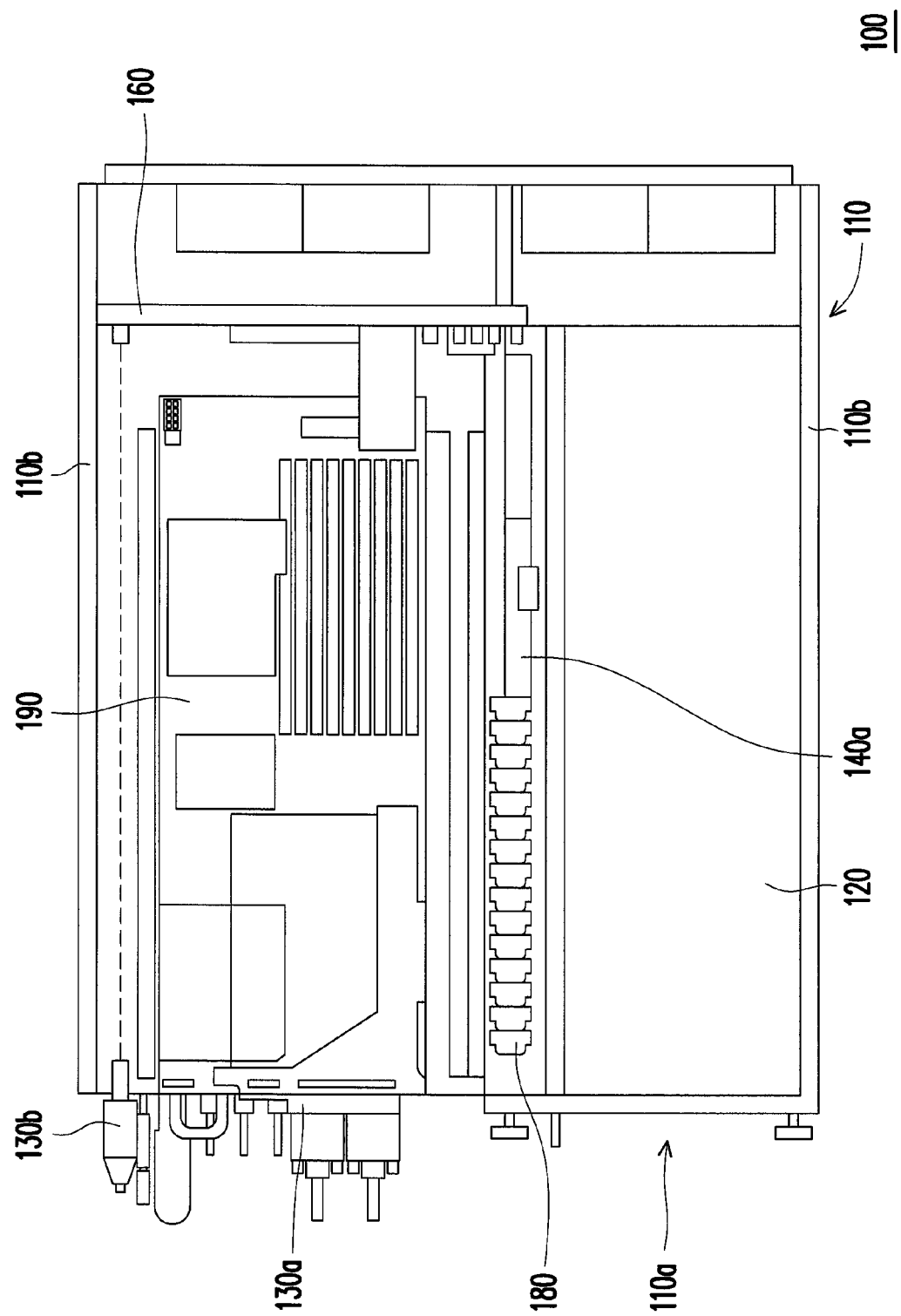
FIG. 7 is a top view illustrating the electronic device depicted in FIG. 1.

FIG. 7 is a top view illustrating the electronic device depicted in FIG. 1. To better illustrate the invention, the top surface of the chassis 110 is not shown in FIG. 7. With reference to FIG. 7, the electronic device 100 of this embodiment further includes a motherboard module 190 configured in the chassis 110. The cable arranging module 180 and the first rail 140a are located between the motherboard module 190 and the hard disc module 120. Owing to said configuration with high density, the volume occupancy of the electronic device 100 is rather small, and the configuration space can be reduced.

Figure 8:
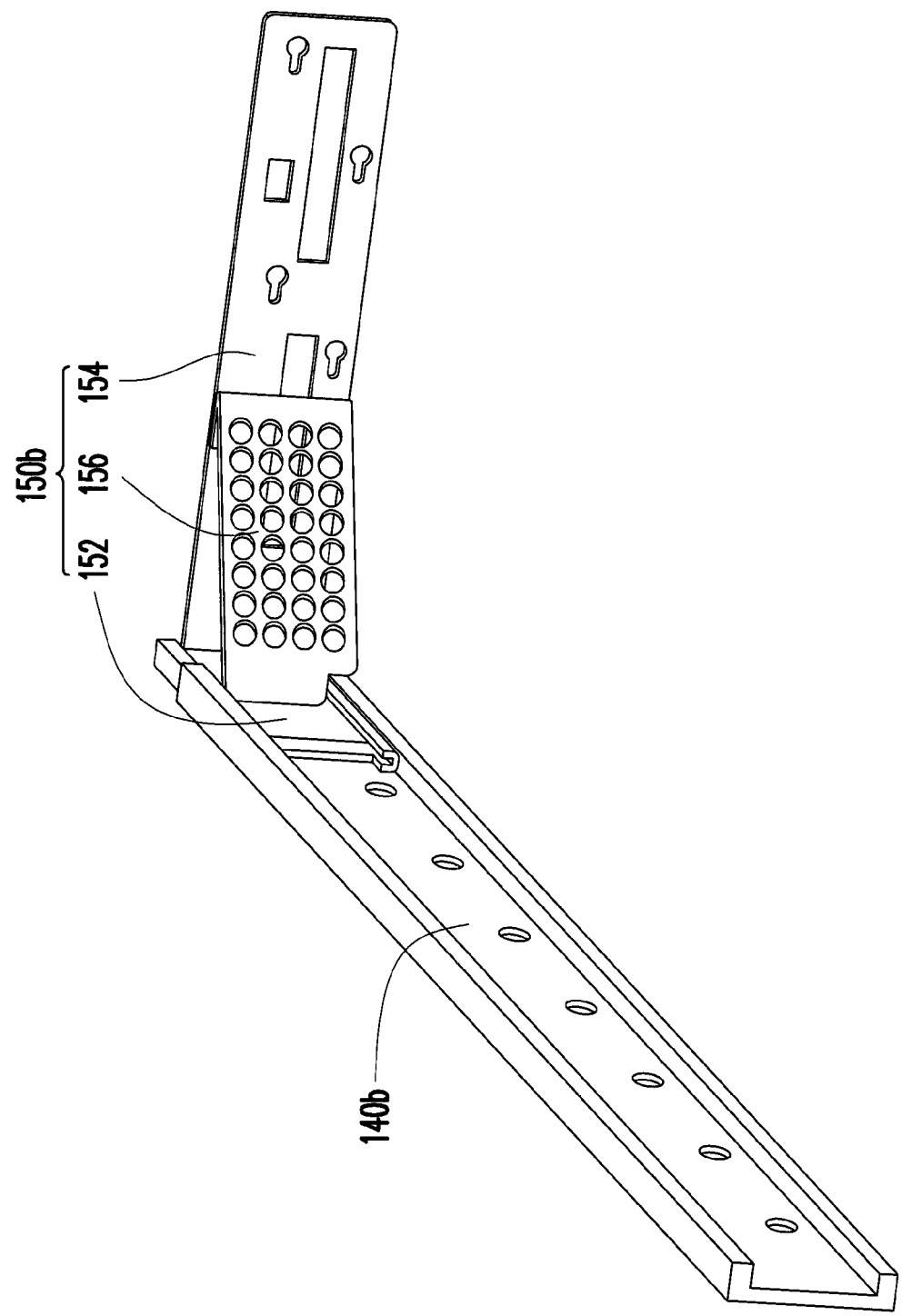
FIG. 8 is a three-dimensional view illustrating some components in the electronic device depicted in FIG. 3.

As indicated in FIG. 3, specifically, the first sliding element 150a of this embodiment is slidably configured at the first side 124b of the hard disc frame 124 and suitable for sliding relative to the first sliding element 150a, such that a portion of the first sliding element 150a extends from the first rail 140a. The hard disc module 120 is suitable for sliding relative to the first sliding element 140a and moves to the portion of the first sliding element 150a extending from the first rail 140a, such that the hard disc module 120 can be completely separated from the first rail 140a. FIG. 8 is a three-dimensional view illustrating some components in the electronic device depicted in FIG. 3. With reference to FIG. 8, the second sliding element 150b of this embodiment includes a sliding portion 152 and a fixing portion 154. The sliding portion 152 is slidably configured on the second rail 140b. The fixing portion 154 is fixed to the back end 124a of the hard disc frame 124 (shown in FIG. 3). The second sliding element 150b is suitable for sliding relative to the second rail 140b, such that the fixing portion 154 extends from the second rail 140b, and that the hard disc module 120 is completely separated from the second rail 140b, as shown in FIG. 3. In this configuration, when the user pulls the hard disc module 120 from the chassis 110 along the first and second rails 140a and 140b, as indicated in FIG. 3, the hard disc module 120 is completely moved out from the chassis 110, which is conducive to maintenance or replacement of the hard disc module 120.

With reference to FIG. 8, particularly, the sliding portion 152 and the fixing portion 154 of this embodiment are two plate-shaped structures perpendicular to each other, and the second sliding element 150b further includes a structure enhancement plate 156. The structure enhancement plate 156 is connected between the sliding portion 152 and the fixing portion 154 to improve the structural strength of the second sliding element 150b. Thereby, the second sliding element 150 bearing the weight of the hard disc module 120 is not deformed and damaged.

Figure 9:
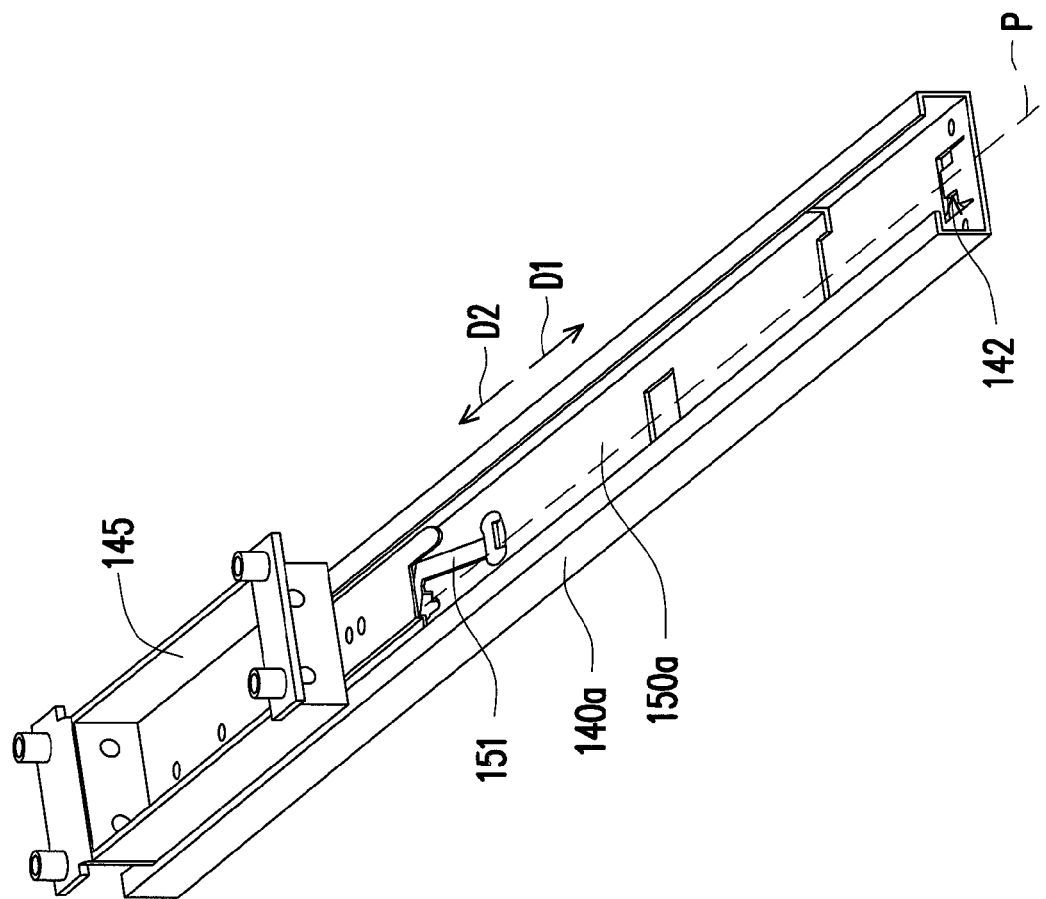
FIG. 9 is a three-dimensional view illustrating some components in the electronic device depicted in FIG. 2.
Figure 10A:
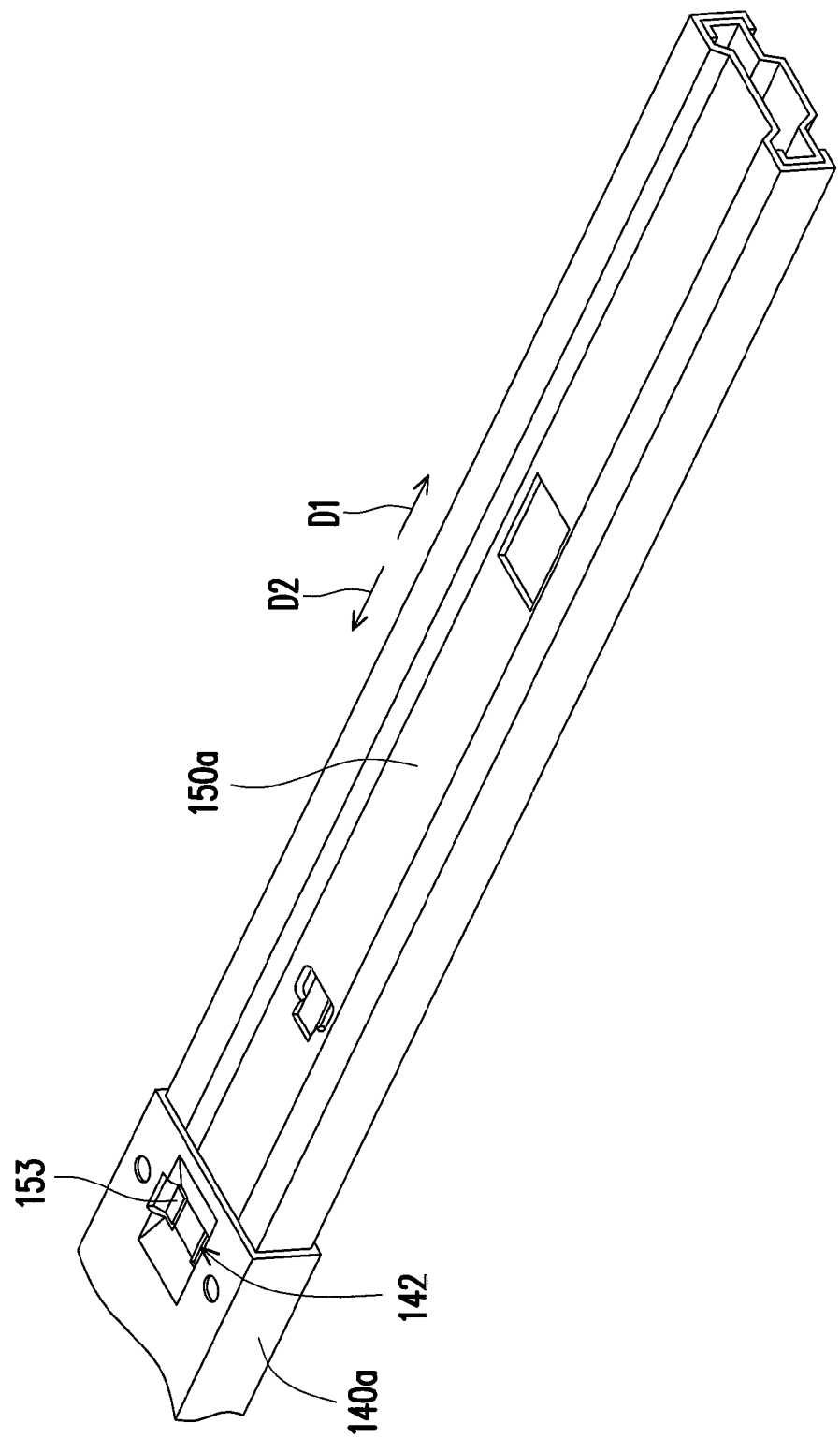
FIG. 10A to FIG. 10D show operation of some components in the electronic device depicted in FIG. 2.

FIG. 9 is a three-dimensional view illustrating some components in the electronic device depicted in FIG. 2. FIG. 10A to FIG. 10D show operation of some components in the electronic device depicted in FIG. 2. FIG. 11 is a three-dimensional view illustrating a first elastic piece depicted in FIG. 9. With reference to FIG. 9, the electronic device 100 further includes a third sliding element 145 that is fixed to the hard disc module 120, as indicated in FIG. 2. The first rail 140a has a locking slot 142, and the first sliding element 150a has a first elastic piece 151. As shown in FIG. 9 and FIG. 10A, the first elastic piece 151 has a first locking hook 153 facing the first rail 140a. The third sliding element 145 is slidably configured on the first sliding element 150a and suitable for sliding relative to the first sliding element 150a along the path P shown in FIG. 9. Here, the first locking hook 153 leans against the first rail 140a and is located on the path P, as indicated in FIG. 9. When the user intends to pull out the hard disc module 120 from the chassis 110, the user can pull the hard disc module 130 depicted in FIG. 2 to drive the third sliding element 145 to move from the position shown in FIG. 2 along a first direction D1, such that the third sliding element 145 pushes the first locking hook 153 and drives the first sliding element 150a to move from the position shown in FIG. 9 to the position shown in FIG. 10A along the first direction D1. Thereby, the first locking hook 153 of the first elastic piece 151 is locked to the locking slot 142, which results in structural interference. Besides, the first locking hook 153 is moved away from the path P, such that the third sliding element 145 is not blocked by the first locking hook 153 and is suitable for sliding along the path P in the subsequent operation.

Due to the structural interference of the first locking hook 153 and the locking slot 142, the third sliding element 145 can no longer slide relative to the first rail 140a along the first direction D1. When the user continues to pull the hard disc module 120, the third sliding element 145 resists the elastic force of the first elastic piece 151, passes the first elastic piece 151, and arrives at the position shown in FIG. 10B. Here, the hard disc module 120 is completely located outside the chassis 110, as indicated in FIG. 3, such that the user can maintain or replace the hard disc module 120.

To be more specific, in case of the structural interference of the first locking hook 153 and the locking slot 142 of the first rail 140a, as indicated in FIG. 10A, the first sliding element 150a partially extends from the first rail 140a. Hence, when the third sliding element 145 slides and arrives at the position shown in FIG. 10B, the third sliding element 145 is away from the first rail 140a, such that the hard disc module 120 fixed to the third sliding element 145 is away from the first rail 140a and completely pulled out from the chassis 110, as indicated in FIG. 3.

Figure 10B:
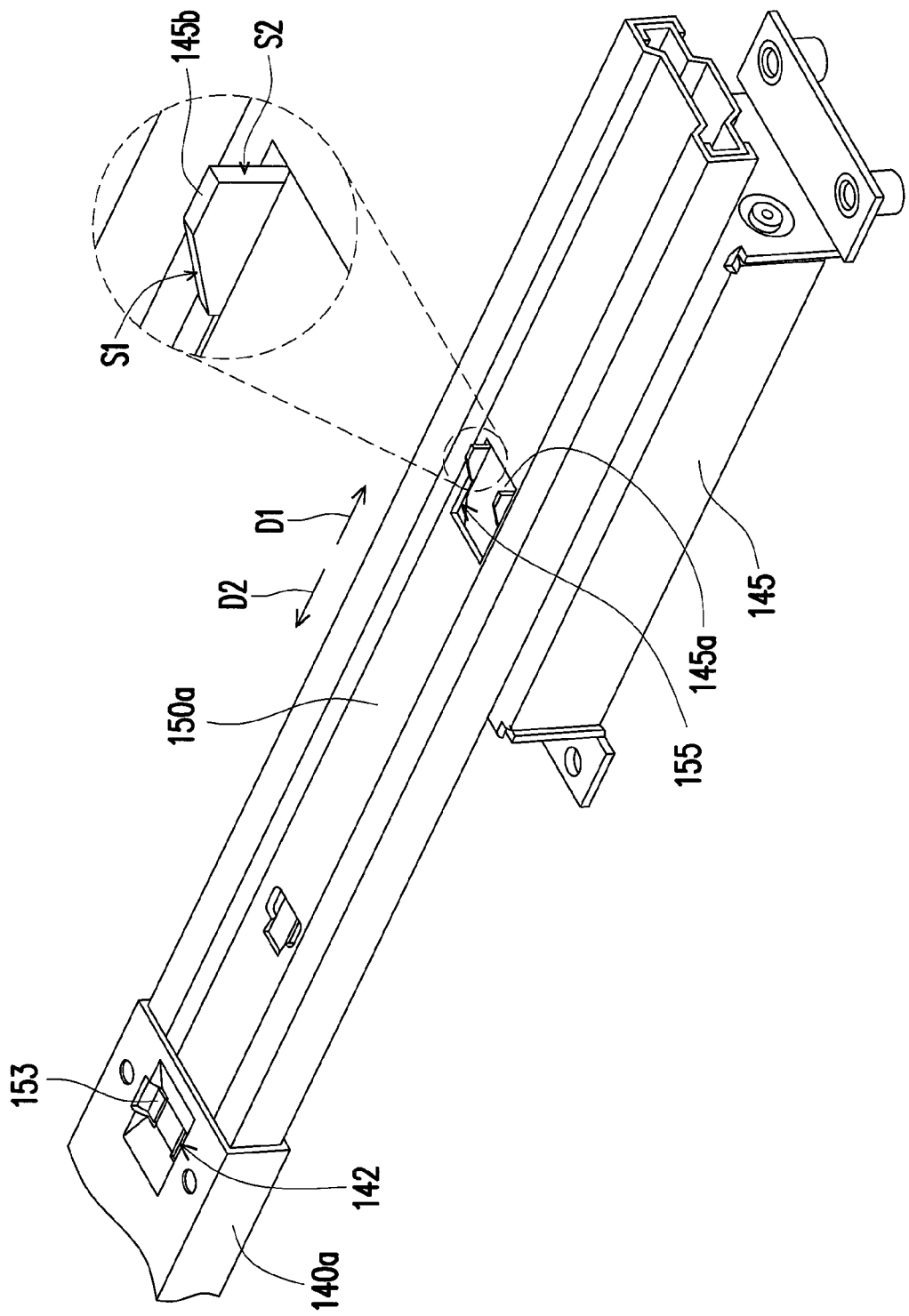
Figure 11:
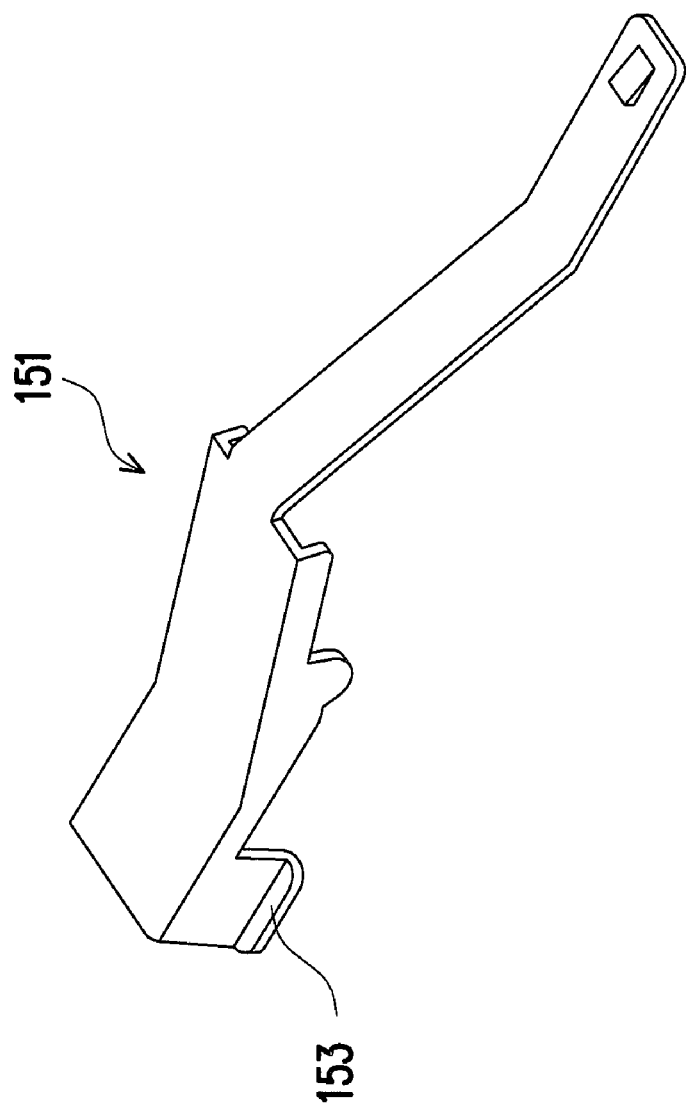
FIG. 11 is a three-dimensional view illustrating the first elastic piece depicted in FIG. 9.
Figure 12:
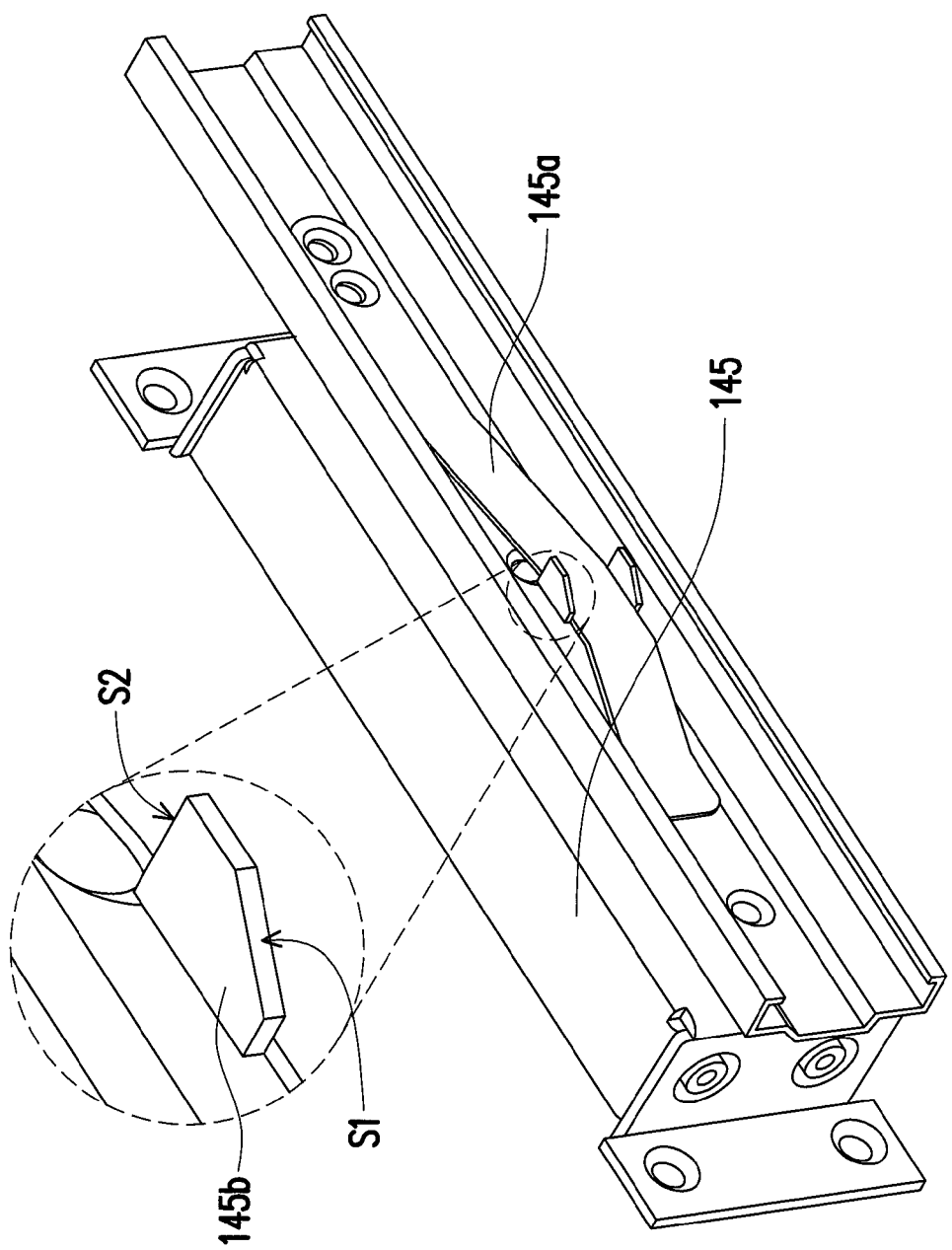
FIG. 12 is a three-dimensional view illustrating the third sliding element depicted in FIG. 10B.

FIG. 12 is a three-dimensional view illustrating the third sliding element depicted in FIG. 10B. With reference to FIG. 10B and FIG. 12, in this embodiment, the first sliding element 150a has a locking slot 155, and the third sliding element 145 has a second elastic piece 145a. When the third sliding element 145 arrives at the position shown in FIG. 10B, an end of the second elastic piece 145a is locked to the locking slot 155 to stop the third sliding element 145 from continuously moving along the first direction D1. Thereby, the hard disc module 120 and the third sliding element 145 do not come off from the first sliding element 150a.

In particular, as shown in FIG. 10B and FIG. 12, the second elastic piece 140a has a second locking hook 145b that is suitable for being locked to the locking slot 155. The second locking hook 145b has a guiding inclined surface S1 and a stopping surface S2 opposite to the guiding inclined surface S1. The second locking hook 145b is suitable for being guided by the guiding inclined surface S1 to lock the locking slot 155 and is suitable for being interfered by the stopping surface S2 and positioned in the locking slot 155.

Figure 10C:
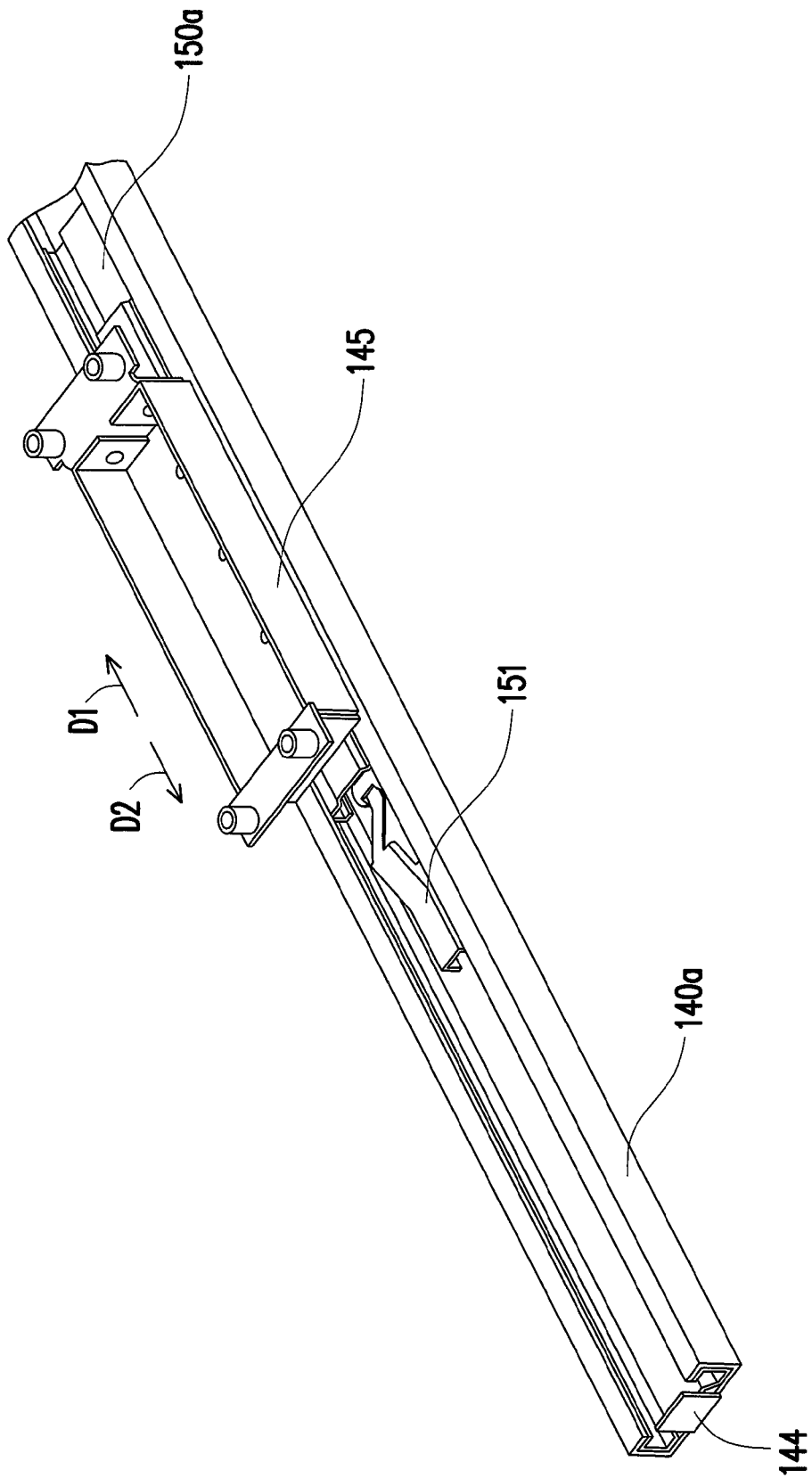
Figure 10D:
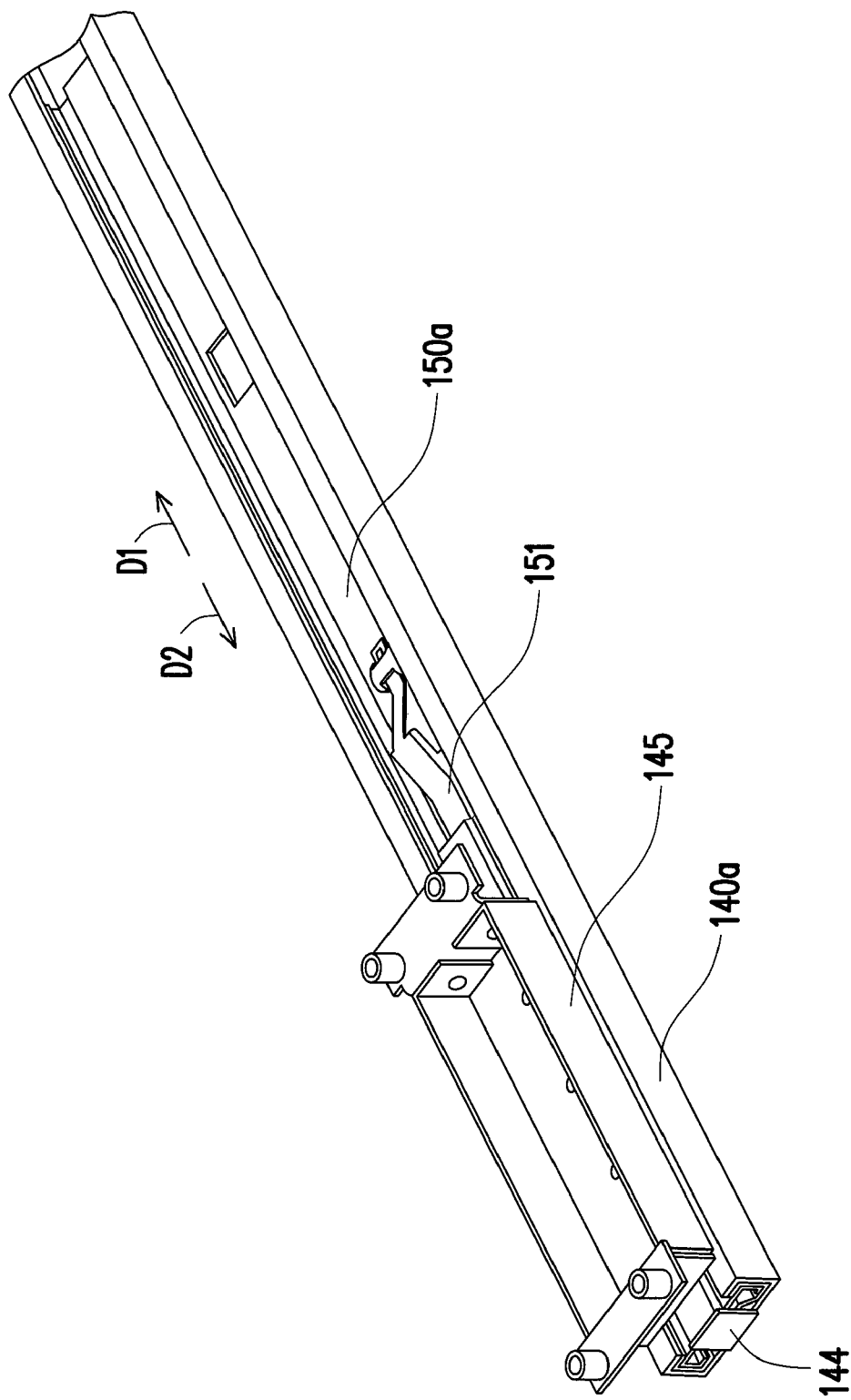

As indicated in FIG. 10C and FIG. 10D, the first rail 140a of this embodiment has a stopping wall 144. When the user intends to place the hard disc module 120 into the chassis 110, the hard disc module 120 shown in FIG. 3 can be pushed to drive the third sliding element 145 to move from the position shown in FIG. 3 along a second direction D2 opposite to the first direction D1. Thereby, the third sliding element 145 pushes the first elastic piece 151 and drives the first sliding element 150a to move from the position shown in FIG. 10B to the position shown in FIG. 10C along the second direction D2, and the first sliding element 150a leans against the stopping wall 144.

The first sliding element 150a is stopped by the stopping wall 144 and cannot continuously slide relative to the first rail 140a along the second direction D2. Therefore, when the user keeps on pushing the hard disc module 120, the third sliding element 145 resists the elastic force of the first elastic piece 151, passes the first elastic piece 151, and arrives at the position shown in FIG. 10D. At this time, the third sliding element 145 leans against the stopping wall 144 and can no longer move along the second direction D2. As such, the sliding range of the hard disc module 120 in the chassis 110 can be restricted.

In light of the foregoing, the hard disc module, the power connection interface, and the data transmission interface of the electronic device are all located at the front end of the chassis in this invention. Thereby, the user can easily extract the hard disc module and plug/unplug power cords and data transmission cables from the front end of the chassis. Besides, the hard disc module can be completely pulled out from the front end of the chassis by sliding the first and second sliding elements relative to the first and second rails, so as to maintain or replace the hard disc module.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An electronic device comprising:
   a chassis having two side plates and a front end;
   a first rail and a second rail, configured in the chassis and parallel to the two side plates;
   a first sliding element and a second sliding element, slidably configured on the first rail and the second rail, respectively; and
   a hard disc module comprising: a hard disc frame having a back end, a first side, and a second side, the first side and the second side being parallel to the two side plates, the second side having a plurality of hard disc plugging openings, wherein the first sliding element is connected to the first side of the hard disc frame, and the second sliding element is connected to the back end of the hard disc frame, such that the hard disc frame is located between the first rail and the second rail, the hard disc module being suitable for being entirely pulled out from the front end of the chassis by sliding the first and second sliding elements relative to the first and second rails; and
   a plurality of hard discs pluggably configured in the hard disc frame, wherein the hard discs are suitable for being installed into or uninstalled from the hard disc frame through the hard disc plugging openings when the hard disc frame is pulled out from the chassis; and
   the second sliding element comprises: a sliding portion slidably configured on the second rail; and a fixing portion fixed to the back end of the hard disc frame, the second sliding element being suitable for sliding relative to the second rail, such that the fixing portion extends from the second rail, and that the hard disc module is completely separated from the second rail; and
   the sliding portion and the fixing portion are two plate-shaped structures perpendicular to each other, and the second sliding element further comprises a structure enhancement plate connected to a closer end of the sliding portion and the fixing portion.

2. The electronic device as claimed in claim 1, further comprising a back plate configured in the hard disc frame and electrically connected to the hard discs.

3. The electronic device as claimed in claim 2, further comprising an adaptor board and a plurality of cables, the adaptor board being configured in the chassis, the cables being connected between the adaptor board and the hard disc module.

4. The electronic device as claimed in claim 3, wherein the back plate has a plurality of connectors respectively connected to the cables.

5. The electronic device as claimed in claim 4, further comprising a cable arranging module, the cable arranging module comprising:

a fixing frame fixed into the chassis, wherein a first segment of each of the cables is fixed to the fixing frame; and a flexible frame connected between the fixing frame and the hard disc module, wherein a second segment of each of the cables is fixed to the flexible frame and is bent together with the flexible frame when the hard disc module drives the flexible frame to move relative to the chassis.

6. The electronic device as claimed in claim 1, further comprising a motherboard module configured in the chassis, the cable arranging module and the first rail being located between the motherboard module and the hard disc module.

7. The electronic device as claimed in claim 1, the first sliding element being slidably configured at the first side of the hard disc frame, the first sliding element being suitable for sliding relative to the first rail, such that a portion of the first sliding element extends from the first rail, the hard disc module being suitable for sliding relative to the first sliding element and moving to the portion of the first sliding element extending from the first rail, such that the hard disc module is completely separated from the first rail.

8. The electronic device as claimed in claim 1, further comprising a data transmission interface configured at the front end of the chassis.

9. The electronic device as claimed in claim 1, further comprising a power connection interface configured at the front end of the chassis.

10. The electronic device as claimed in claim 2, wherein the back plate is fixed to the first side of the hard disc frame.

11. The electronic device as claimed in claim 1, further comprising a third sliding element fixed to the hard disc module, the first rail having a first locking slot, the first sliding element having a first elastic piece, the first elastic piece having a first locking hook facing the first rail, the third sliding element being slidably configured on the first sliding element and suitable for sliding relative to the first sliding element along a path, the first locking hook leaning against the first rail and being located on the path, when the third sliding element is driven to move from a first position along a first direction, the third sliding element pushing the first locking hook to move the first sliding element toward the first locking slot along the first direction, the first locking hook locking the first locking slot and moving away from the path, when the third sliding element is continuously driven to move along the first direction, the third sliding element resisting an elastic force of the first elastic piece, passing the first elastic piece, and arriving at a second position.

12. The electronic device as claimed in claim 11, the first sliding element having a second locking slot, the third sliding element having a second elastic piece, wherein when the third sliding element arrives at the second position, an end of the second elastic piece is locked to the second locking slot to stop the third sliding element from continuously moving along the first direction.

13. The electronic device as claimed in claim 12, the second elastic piece having a second locking hook suitable for locking the second locking slot, the second locking hook having a guiding inclined surface and a stopping surface opposite to the guiding inclined surface, wherein the second locking hook is suitable for being guided by the guiding inclined surface to lock the second locking slot and is suitable for being interfered by the stopping surface and positioned in the second locking slot.

14. The electronic device as claimed in claim 11, the first rail having a stopping wall, wherein when the third sliding element is driven and moved from the second position along a second direction opposite to the first direction to push the first elastic piece, the first sliding element is driven and moved toward the stopping wall and leans against the stopping wall, such that the first sliding element is stopped from moving along the second direction; when the third sliding element is continuously driven and moved along the second direction, the third sliding element resists the elastic force of the first elastic piece, passes the first elastic piece, and arrives at the first position; and when the third sliding element is located at the first position, the third sliding element leans against the stopping wall, such that the third sliding element is stopped from moving along the second direction.

\* \* \* \* \*